United States Patent
Choi et al.

(10) Patent No.: US 10,680,207 B2
(45) Date of Patent: Jun. 9, 2020

(54) ELECTROLUMINESCENT DISPLAY DEVICE HAVING REFLECTIVE PATTERNS WITHIN DEPRESSED PORTIONS

(71) Applicant: LG Display Co., Ltd., Seoul (KR)

(72) Inventors: Min-Geun Choi, Paju-si (KR); Woo-Ram Youn, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 16/198,272

(22) Filed: Nov. 21, 2018

(65) Prior Publication Data

US 2019/0165321 A1 May 30, 2019

(30) Foreign Application Priority Data

Nov. 30, 2017 (KR) .......................... 10-2017-0163171

(51) Int. Cl.
*H01L 51/52* (2006.01)
*H01L 27/32* (2006.01)

(52) U.S. Cl.
CPC ........ *H01L 51/5271* (2013.01); *H01L 27/322* (2013.01); *H01L 27/3246* (2013.01); *H01L 27/3258* (2013.01); *H01L 51/5221* (2013.01); *H01L 51/5275* (2013.01); *H01L 51/5209* (2013.01); *H01L 2251/5323* (2013.01)

(58) Field of Classification Search
CPC ............. H01L 51/5271; H01L 51/5221; H01L 51/5275; H01L 27/322; H01L 27/3246; H01L 27/3258
See application file for complete search history.

(56) References Cited

U.S. PATENT DOCUMENTS

| | | | | |
|---|---|---|---|---|
| 6,894,432 | B2* | 5/2005 | Fujieda | H01L 51/5206 313/498 |
| 8,604,484 | B2* | 12/2013 | Kim | G02F 1/1362 257/258 |
| 9,608,045 | B2* | 3/2017 | Matsumoto | H01L 27/322 |
| 9,991,320 | B2* | 6/2018 | Joung | H01L 27/3258 |
| 10,008,697 | B2* | 6/2018 | Jang | H01L 51/56 |
| 10,319,796 | B2* | 6/2019 | Jang | H01L 51/5209 |
| 10,347,871 | B2* | 7/2019 | Joung | H01L 27/322 |
| 2007/0222925 | A1* | 9/2007 | Park | G02F 1/133555 349/114 |
| 2017/0062770 | A1 | 3/2017 | Jang et al. | |
| 2018/0212198 | A1* | 7/2018 | Inoue | H01L 51/5271 |
| 2019/0189715 | A1* | 6/2019 | Nendai | H01L 51/5275 |
| 2019/0229294 | A1* | 7/2019 | Kobori | H01L 27/3246 |
| 2020/0083483 | A1* | 3/2020 | Ueda | H01L 51/5271 |

FOREIGN PATENT DOCUMENTS

EP 3 343 659 A1 7/2018

* cited by examiner

*Primary Examiner* — Ida M Soward
(74) *Attorney, Agent, or Firm* — Seed IP Law Group LLP (57) ABSTRACT

An electroluminescent display device includes a first substrate including an emissive area; an overcoat layer disposed over the first substrate and including a plurality of protruding portions and a plurality of depressed portions in the emissive area; a first electrode disposed over the overcoat layer and including an electrode portion which corresponds to each of the plurality of protruding portions and an opening which corresponds to each of the plurality of depressed portions; a light-emitting layer disposed over the electrode portion; a second electrode disposed over the light-emitting layer; and a reflective pattern disposed over each of the plurality of depressed portions.

12 Claims, 6 Drawing Sheets

Related Art

ELECTROLUMINESCENT DISPLAY DEVICE HAVING REFLECTIVE PATTERNS WITHIN DEPRESSED PORTIONS

CROSS-REFERENCE TO RELATED APPLICATIONS

This application claims the benefit under 35 U.S.C. § 119(a) of Korean Patent Application No. 2017-0163171, filed on Nov. 30, 2017, in the Korean Intellectual Property Office, which is incorporated herein by reference in its entirety.

BACKGROUND

Technical Field

The present disclosure relates to an electroluminescent display device, and more particularly, to an electroluminescent display device capable of effectively outputting light in both directions up and down.

Description of the Related Art

In recent years, flat panel displays having excellent characteristics such as being thin, being lightweight, and having low power consumption have been widely developed and applied to various fields.

Among the flat panel displays, an electroluminescent display device is a device in which electrical charge carriers are injected into a light-emitting layer formed between a cathode, which is an electron-injecting electrode, and an anode, which is a hole-injecting electrode, such that excitons are formed, and then radiative recombination of the excitons occurs, thereby emitting light.

The electroluminescent display device can be formed using a flexible substrate such as plastic because it is self-luminous, and has excellent contrast ratios. Further the electroluminescent display device has a response time of several micro seconds, and there are advantages in displaying moving images. The electroluminescent display device also has wide viewing angles and is stable under low temperatures. Since the electroluminescent display device is driven by a low voltage of direct current DC 5V to 15V, it is easy to design and manufacture driving circuits.

Figure 1:
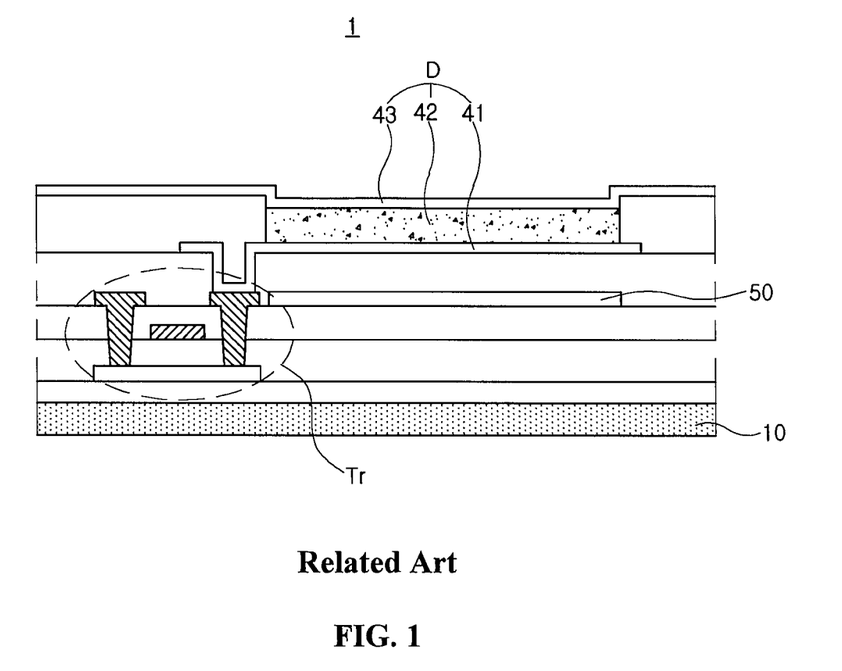
FIG. 1 is a cross-sectional view schematically illustrating a related art electroluminescent display device.

FIG. 1 is a cross-sectional view schematically illustrating a related art electroluminescent display device.

As illustrated in FIG. 1, an electroluminescent display device 1 includes a substrate 10, a thin film transistor Tr disposed on the substrate 10, a light-emitting diode D disposed on the substrate 10 and connected to the thin film transistor Tr, and a color filter pattern 50 under the light-emitting diode D. An encapsulation layer (not shown) may be disposed on the light-emitting diode D.

The light-emitting diode D includes a first electrode 41, a light-emitting layer 42, and a second electrode 43, wherein light from the light-emitting layer 42 is output to the outside through the first electrode 41.

The light emitted from the light-emitting layer 42 passes through various configurations of the electroluminescent display device 1 and exits the electroluminescent display device 1.

However, an optical waveguide mode which is configured by a surface plasmon component generated at a boundary between a metal and the light-emitting layer 42 and the light-emitting layer 42 inserted between reflective layers at both sides accounts for about 60 to 70% of emitted light.

Accordingly, among light emitted from the light-emitting layer 42, rays of light that are trapped in the electroluminescent display device 1 instead of exiting the electroluminescent display device 1 are present. Thus, there is a problem in that light extraction efficiency of the electroluminescent display device 1 is degraded.

Further, in recent years, display devices have been applied to various fields such as mobile phones capable of dual display, and thus there has been a demand for an electroluminescent display device which allows viewing in both directions.

BRIEF SUMMARY

Accordingly, embodiments of the present disclosure are directed to an electroluminescent display device that substantially obviates one or more of the problems due to limitations and disadvantages of the related art.

It is an object of the present disclosure to provide an electroluminescent display device that improves light extraction efficiency and is able to emit light in both directions.

Further, it is another object of the present disclosure to provide an electroluminescent display device that simplifies a manufacturing process.

To achieve the above-described object, the present disclosure provides an electroluminescent display device includes a first substrate including an emissive area; an overcoat layer disposed over the first substrate and including a plurality of protruding portions and a plurality of depressed portions in the emissive area; a first electrode disposed over the overcoat layer and including an electrode portion which corresponds to each of the plurality of protruding portions and an opening which corresponds to each of the plurality of depressed portions; a light-emitting layer disposed over the electrode portion; a second electrode disposed over the light-emitting layer; and a reflective pattern disposed over each of the plurality of depressed portions.

It is to be understood that both the foregoing general description and the following detailed description are by example and explanatory, and are intended to provide further explanation of the present disclosure as claimed.

BRIEF DESCRIPTION OF THE SEVERAL VIEWS OF THE DRAWINGS

The accompanying drawings, which are included to provide a further understanding of the present disclosure and which are incorporated in and constitute a part of this specification, illustrate embodiments of the present disclosure and together with the description serve to explain various principles of the present disclosure. In the drawings.

DETAILED DESCRIPTION

Hereinafter, exemplary embodiments of the present disclosure will be described with reference to the accompanying drawings.

First Embodiment

Figure 2:
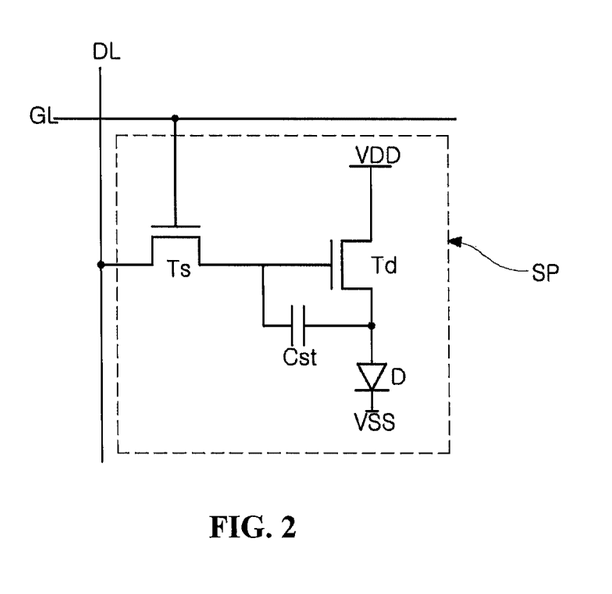
FIG. 2 is a circuit diagram illustrating a single subpixel area of an electroluminescent display device according to an embodiment of the present disclosure.

FIG. 2 is a circuit diagram illustrating a single subpixel area of an electroluminescent display device according to an embodiment of the present disclosure.

As illustrated in FIG. 2, the electroluminescent display device according to the embodiment of the present disclosure includes a gate line GL, a data line DL, a switching thin film transistor Ts, a driving thin film transistor Td, a storage capacitor Cst and a light-emitting diode D. The gate line GL and the data line DL cross each other to define a subpixel area SP. The switching thin film transistor Ts, the driving thin film transistor Td, the storage capacitor Cst and the light-emitting diode D are formed in the subpixel area SP.

More specifically, a gate electrode of the switching thin film transistor Ts is connected to the gate line GL and a source electrode of the switching thin film transistor Ts is connected to the data line DL. A gate electrode of the driving thin film transistor Td is connected to a drain electrode of the switching thin film transistor Ts, and a source electrode of the driving thin film transistor Td is connected to a high voltage supply VDD. An anode of the light-emitting diode D is connected to a drain electrode of the driving thin film transistor Td, and a cathode of the light-emitting diode D is connected to a low voltage supply VSS. The storage capacitor Cst is connected to the gate electrode and the drain electrode of the driving thin film transistor Td.

The electroluminescent display device is driven to display an image. For example, when the switching thin film transistor Ts is turned on by a gate signal applied through the gate line GL, a data signal from the data line DL is applied to the gate electrode of the driving thin film transistor Td and an electrode of the storage capacitor Cst through the switching thin film transistor Ts.

When the driving thin film transistor Td is turned on by the data signal, an electric current flowing through the light-emitting diode D is controlled, thereby displaying an image. The light-emitting diode D emits light due to the current supplied through the driving thin film transistor Td from the high voltage supply VDD.

That is, the amount of the current flowing through the light-emitting diode D is proportional to the magnitude of the data signal, and the intensity of light emitted by the light-emitting diode D is proportional to the amount of the current flowing through the light-emitting diode D. Thus, subpixel areas SP show different gray levels depending on the magnitude of the data signal, and as a result, the electroluminescent display device displays an image.

The storage capacitor Cst maintains charges corresponding to the data signal for a frame when the switching thin film transistor Ts is turned off. Accordingly, even if the switching thin film transistor Ts is turned off, the storage capacitor Cst allows the amount of the current flowing through the light-emitting diode D to be constant and the gray level shown by the light-emitting diode D to be maintained until a next frame.

A transistor and/or a capacitor other than the switching and driving thin film transistors Ts and Td and the storage capacitor Cst may be further added to the subpixel area SP.

Figure 3:
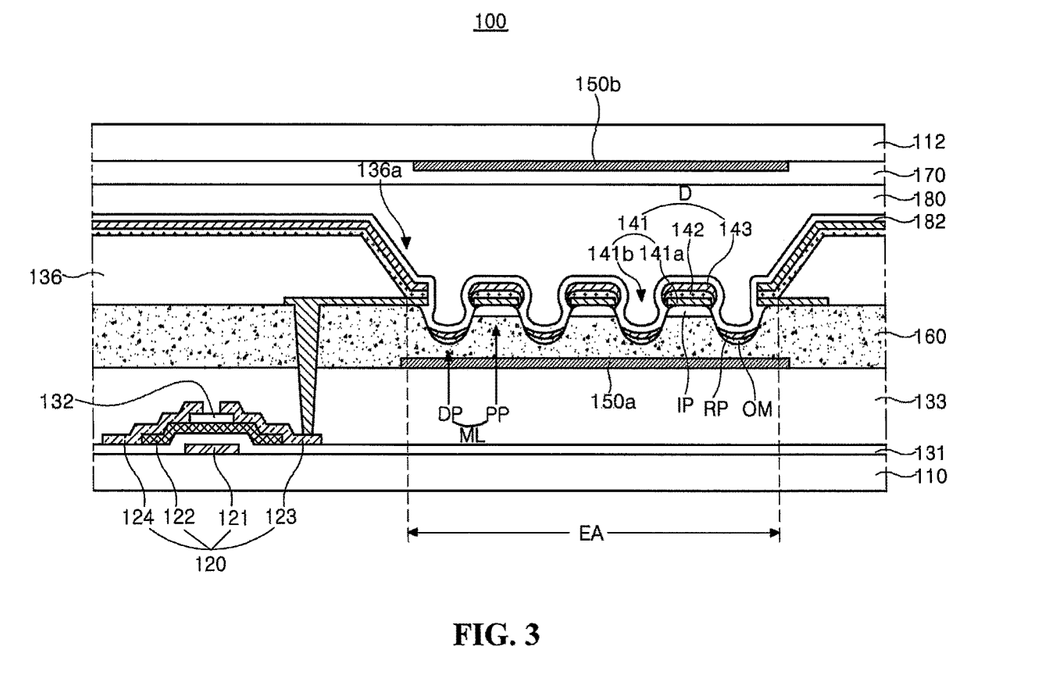
FIG. 3 is a cross-sectional view schematically illustrating an electroluminescent display device according to a first embodiment of the present disclosure.

FIG. 3 is a cross-sectional view schematically illustrating an electroluminescent display device according to a first embodiment of the present disclosure.

As illustrated in FIG. 3, an electroluminescent display device 100 according to the first embodiment of the present disclosure includes first and second substrates 110 and 112, a thin film transistor 120, bottom and top color filter patterns 150a and 150b, an overcoat layer 160, and a light-emitting diode D electrically connected to the thin film transistor 120.

The electroluminescent display device 100 according to the first embodiment of the present disclosure may include a thin film transistor 120 which includes a gate electrode 121, an active layer 122, a source electrode 123, and a drain electrode 124 on the first substrate 110.

Specifically, the gate electrode 121 of the thin film transistor 120 and a gate insulation layer 131 may be disposed on the first substrate 110.

The active layer 122, which overlaps the gate electrode 121, may be disposed on the gate insulation layer 131.

An etch stopper 132 for protecting a channel region of the active layer 122 may be disposed on the active layer 122.

The source electrode 123 and the drain electrode 124 may be disposed on the active layer 122 and contact the active layer 122.

The electroluminescent display device 100 to which the first embodiment of the present disclosure is applicable is not limited to that illustrated in FIG. 3. The electroluminescent display device 100 may further include a buffer layer disposed between the first substrate 110 and the active layer 122, and the etch stopper 132 may not be disposed thereon.

For convenience of description, only the driving thin film transistor has been illustrated from among various thin film transistors that may be included in the electroluminescent display device 100. Although the thin film transistor 120 will be described as having an inverted staggered structure or bottom gate structure in which the gate electrode 121 is disposed at an opposite side of the source electrode 123 and the drain electrode 124 with respect to the active layer 122, this is merely an example, and a thin film transistor which has a coplanar structure or top gate structure, in which the gate electrode 121 is disposed at the same side as the source electrode 123 and the drain electrode 124 with respect to the active layer 122, may also be used.

A first passivation layer 133 may be disposed on the drain electrode 124 and the source electrode 123, and the bottom color filter pattern 150a may be disposed on the first passivation layer 133.

In this case, although the first passivation layer 133 is illustrated as flattening an upper portion of the thin film transistor 120, the first passivation layer 133 may also be disposed along the shapes of surfaces of elements located below the first passivation layer 133 instead of flattening the upper portion of the thin film transistor 120.

The electroluminescent display device 100 according to the first embodiment of the present disclosure may include the top color filter pattern 150b which is disposed between the second substrate 112 and a second electrode 143 and corresponds to the bottom color filter pattern 150a.

The bottom and top color filter patterns 150a and 150b are configured to change a color of light emitted from a light-emitting layer 142, and may be one of a red color filter pattern, a green color filter pattern, and a blue color filter pattern.

The bottom and top color filter patterns 150a and 150b may be disposed at a position which corresponds to an emissive area EA and may be disposed only in some portions of the emissive area EA.

Emissive area EA refers to an area in which the light-emitting layer 142 emits light by a first electrode 141 and the second electrode 143 and an area in which light output from the light-emitting layer 142 by the first electrode 141 and the second electrode 143 is reflected by a reflective pattern RP and output. Disposing the bottom and top color filter patterns 150a and 150b at a position corresponding to the emissive area EA means that the bottom and top color filter patterns 150a and 150b are disposed to prevent a blurring phenomenon and a ghost phenomenon which occurs due to mixing of light emitted from adjacent emissive areas EA.

For example, the bottom and top color filter patterns 150a and 150b may be disposed to overlap the emissive area EA and have a size smaller than or equal to that of the emissive area EA.

However, positions and sizes of the bottom and top color filter patterns 150a and 150b may vary in accordance with the size, position, and the like of the emissive area EA.

A pixel of the present disclosure may include one or more subpixels. For example, a single pixel may include two to four subpixels.

Subpixel refers to a unit in which a specific type of bottom and top color filter patterns 150a and 150b are formed, or in which the light-emitting diode D is capable of emitting a particular color without the bottom and top color filter patterns 150a and 150b.

Colors defined in a subpixel may include red (R), green (G), blue (B), and, optionally, white (W), but embodiments are not limited thereto.

The overcoat layer 160 may be disposed on the bottom color filter pattern 150a and the first passivation layer 133.

The first passivation layer 133 may be omitted. That is, the overcoat layer 160 may be disposed on the thin film transistor 120.

In the figure, the bottom color filter pattern 150a is disposed on the first passivation layer 133, but embodiments are not limited thereto. The bottom color filter pattern 150a may be disposed at any position between the overcoat layer 160 and the first substrate 110.

Particularly, in order to improve light extraction efficiency in the electroluminescent display device 100 according to the first embodiment of the present disclosure, a micro lens ML may be disposed in the overcoat layer 160 corresponding to the emissive area EA.

The micro lens ML may include a plurality of depressed portions DP and a plurality of protruding portions PP, but embodiments are not limited thereto. The micro lens ML may have various other forms.

For example, a micro lens ML which includes a plurality of protruding portions PP and connecting portions connecting adjacent protruding portions PP may also be formed in the overcoat layer 160.

The overcoat layer 160 serves as a planarizing layer in an area in which the plurality of depressed portions DP and the plurality of protruding portions PP are not disposed.

A portion of the overcoat layer 160 serving as the planarizing layer may be formed to be thicker than a portion of the overcoat layer 160 in which the micro lens ML is formed, but embodiments are not limited thereto.

Each of the plurality of depressed portions DP may have various shapes such as a hexagonal shape, a semicircular shape, a semielliptical shape, and a quadrilateral shape in plan view.

In addition, a top surface of each of the plurality of protruding portions PP may be formed to be flat.

Meanwhile, each of the plurality of depressed portions DP may have a shape in which a width progressively narrows toward the first substrate 110. For example, each of the plurality of depressed portions DP may have a semicircular shape or a trapezoidal shape in cross-sectional view, but embodiments are not limited thereto.

Further, the overcoat layer 160 may be formed of an organic material having a refractive index of about 1.5 to 1.55, but embodiments are not limited thereto.

In the electroluminescent display device 100 according to the first embodiment of the present disclosure, the reflective pattern RP may be disposed over each of the plurality of depressed portions DP.

The reflective patterns RP may be formed of aluminum (Al), magnesium (Mg), silver (Ag), or an alloy thereof, but embodiments are not limited thereto.

In addition, the reflective patterns RP may be disposed along the shape of the plurality of depressed portions DP.

The reflective patterns RP may also be formed only in partial areas of the plurality of depressed portions DP. That is, the reflective pattern RP may be formed to cover only a partial area of the corresponding depressed portion DP or formed to cover an entirety of the corresponding depressed portion DP.

In the meantime, a residual layer OM formed of the same material as the light-emitting layer 142 may be present between the plurality of depressed portions DP and the respective reflective patterns RP.

The residual layer OM is formed when materials for forming the light-emitting layer 142 are left on a top surface of each of the plurality of depressed portions DP during a manufacturing process.

Further, in the electroluminescent display device 100 according to the first embodiment of the present disclosure, an insulating pattern IP may be disposed on a top surface of each of the plurality of protruding portions PP.

Here, a refractive index of the insulating pattern IP may be larger than a refractive index of the overcoat layer 160.

As described above, in the electroluminescent display device 100 according to the first embodiment of the present disclosure, the reflective pattern RP may be disposed corresponding to each of the plurality of depressed portions DP of the overcoat layer 160, and the insulating pattern IP having a refractive index larger than that of the overcoat layer 160 may be disposed corresponding to each of the plurality of protruding portions PP of the overcoat layer 160.

Accordingly, a portion of light output from the light-emitting diode D toward the first substrate 110 may be refracted to a place where the reflective pattern RP is disposed by using the difference in the refractive indices of the insulating pattern IP and the overcoat layer 160, and the reflective pattern RP may reflect incident light toward the second substrate 112 to realize upward emission, so that dual emission toward both the first substrate 110 and the second substrate 112 is possible.

In addition, the reflective pattern RP may be formed of the same material and at the same time in the same process steps as the second electrode 143. In this case, the reflective pattern RP may be formed at each of the plurality of depressed portions DP by using the same process used when forming the second electrode 143 without a separate process. Therefore, an additional process is not required, thereby reducing the overall manufacturing costs and number of process involved.

Meantime, the light-emitting diode D including the first electrode 141, the light-emitting layer 142, and the second electrode 143 may be disposed on the overcoat layer 160 and the insulating pattern IP.

Here, the first electrode 141 may be an anode or a cathode for supplying one of electrons or holes to the light-emitting layer 142.

A case in which the first electrode 141 of the electroluminescent display device 100 according to the first embodiment of the present disclosure is an anode will be described as an example.

The first electrode 141 may be formed of a conductive material having relatively high work function. For example, the first electrode 141 may be formed of a transparent conductive material such as indium-tin-oxide (ITO) and indium-zinc-oxide (IZO).

The first electrode 141 may be connected to the source electrode 123 of the thin film transistor 120 through a contact hole formed in the overcoat layer 160 and may be separately formed for each subpixel area.

The electroluminescent display device 100 according to the first embodiment of the present disclosure has been described as an example in which the thin film transistor 120 is an N-type thin film transistor and the first electrode 141 is connected to the source electrode 123, but embodiments are not limited thereto. When the thin film transistor 120 is a P-type thin film transistor, the first electrode 141 may also be connected to the drain electrode 124.

The first electrode 141 may also be electrically connected to the light-emitting layer 142 by being in contact with the light-emitting layer 142 with a conductive material therebetween.

The first electrode 141 of the electroluminescent display device 100 according to the first embodiment of the present disclosure may be disposed on the insulating pattern IP in the emissive area EA.

Further, the first electrode 141 may include electrode portions 141a and a plurality of openings 141b.

Here, the electrode portions 141a of the first electrode 141 may be disposed corresponding to the respective insulating patterns IP, which are formed corresponding to the plurality of protruding portions PP, respectively. That is, the plurality of protruding portions PP of the overcoat layer 160, the insulating patterns IP, and the electrode portions 141a may be stacked in that order.

The plurality of openings 141b of the first electrode 141 may be disposed corresponding to the plurality of depressed portions DP, respectively. That is, the reflective patterns RP formed corresponding to the plurality of depressed portions DP, respectively, may be exposed by the plurality of openings 141b of the first electrode 141.

The electrode portions 141a of the first electrode 141 may have a flat top surface, but embodiments are not limited thereto.

Further, a bank layer 136 may be disposed on the overcoat layer 160 and the first electrode 141.

The bank layer 136 may include an open portion 136a exposing the first electrode 141.

The bank layer 136 may be disposed between adjacent pixel (or subpixel) areas and serve to differentiate the adjacent pixel (or subpixel) areas.

Here, the plurality of depressed portions DP and the plurality of protruding portions PP of the overcoat layer 160 may be disposed in the open portion 136a of the bank layer 136.

That is, since the plurality of depressed portions DP and the plurality of protruding portions PP of the overcoat layer 160 are disposed to overlap the bottom and top color filter patterns 150a and 150b, the plurality of depressed portions DP and the plurality of protruding portions PP of the overcoat layer 160 may overlap the bottom and top color filter patterns 150a and 150b and the open portion 136a of the bank layer 136.

The light-emitting layer 142 may be disposed on the electrode portions 141a of the first electrode 141 exposed by the open portion 136a of the bank layer 136. That is, the light-emitting layer 142 may be disposed corresponding to the electrode portions 141a of the first electrode 141.

The light-emitting layer 142 may have a tandem white structure in which a plurality of light-emitting layers are stacked to emit white light. For example, the light-emitting layer 142 may include a first light-emitting layer configured to emit blue light and a second light-emitting layer disposed on the first light-emitting layer and configured to emit light having a color which turns white when mixed with blue, but embodiments are not limited thereto.

In this case, a luminescent material of the light-emitting layer 142 may be an organic luminescent material or an inorganic luminescent material such as a quantum dot.

The light-emitting layer 142 may be disposed along the shape of the electrode portions 141a of the first electrode 141 in the emissive area EA. For example, the light-emitting layer 142 may have a flat top surface.

The second electrode 143 for supplying one of electrons or holes to the light-emitting layer 142 may be disposed on the light-emitting layer 142.

In this case, the second electrode 143 may be an anode or a cathode.

A case in which the second electrode 143 of the electroluminescent display device 100 according to the first embodiment of the present disclosure is a cathode will be described as an example.

The second electrode 143 may be formed of a conductive material having relatively low work function and may be located substantially all over a display area in which an image is displayed. For example, the second electrode 143 may be formed of aluminum (Al), magnesium (Mg), silver (Ag), or an alloy thereof to obtain a micro-cavity effect, but embodiments are not limited thereto.

In this case, the second electrode 143 may be formed corresponding to the light-emitting layer 142 in the emissive area EA. That is, the second electrode 143 may be disposed over the light-emitting layer 142 corresponding to the electrode portions 141a of the first electrode 141.

The first electrode 141, the light-emitting layer 142, and the second electrode 143 may form the light-emitting diode D, and the light-emitting diode D may have holes which correspond to the plurality of depressed portions DP of the overcoat layer 160 respectively.

Accordingly, the light-emitting diode D may expose the reflective patterns RP disposed on the plurality of depressed portions DP respectively.

In this way, the light-emitting diode D including holes may be implemented using the plurality of depressed portions DP and the plurality of protruding portions PP of the overcoat layer 160.

Further, a second passivation layer 182, which is configured to cover the second electrode 143, the reflective patterns RP, and the insulating patterns IP, may be formed.

An encapsulation layer 180 may be formed on the second passivation layer 182. That is, the encapsulation layer 180 may include at least one inorganic layer and at least one organic layer to prevent permeation of oxygen or moisture into the light-emitting layer 142 and the second electrode 143.

The top color filter pattern 150b may be disposed corresponding to the emissive area EA between the encapsulation layer 180 of the first substrate 110 and the second substrate 112, and a planarizing layer 170 may be disposed between the top color filter pattern 150b and the encapsulation layer 180.

In the electroluminescent display device 100 according to the first embodiment of the present disclosure, the micro lens ML of the overcoat layer 160 may allow output of light which has not been extracted to the outside due to total reflection of the light inside the first electrode 141 and the light-emitting layer 142 among light emitted from the light-emitting layer 142. In this way, external luminous efficiency may be increased.

In addition, the reflective patterns RP may be disposed corresponding to the plurality of depressed portions DP of the overcoat layer 160, and the insulating patterns IP having a refractive index larger than that of the overcoat layer 160 may be disposed corresponding to the plurality of protruding portions PP.

Accordingly, a portion of light output from the light-emitting diode D toward the first substrate 110 may be refracted to a place where the reflective pattern RP is disposed by using the difference in the refractive indices of the insulating pattern IP and the overcoat layer 160, and the reflective pattern RP may reflect incident light toward the second substrate 112 to realize upward emission, so that light may be effectively output toward both the first substrate 110 and the second substrate 112.

Figure 4:
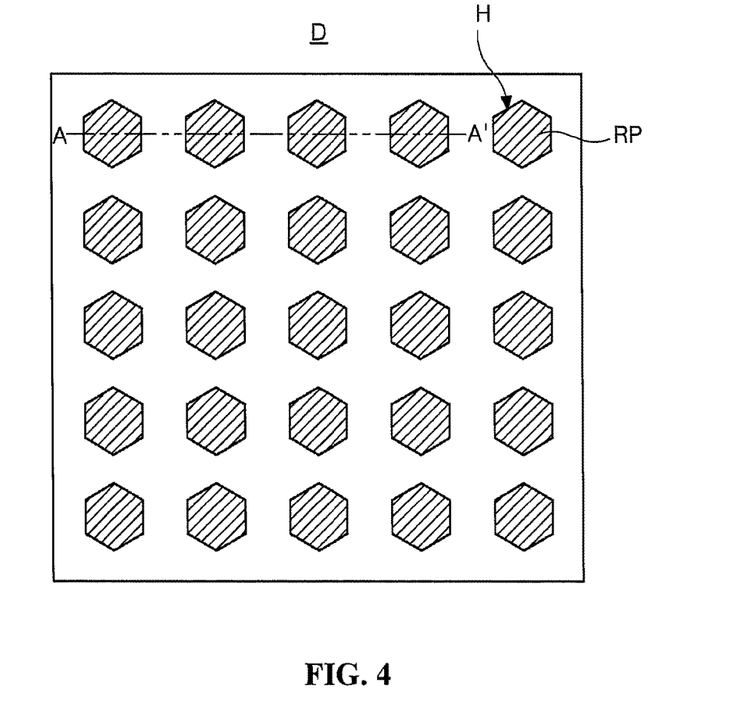
FIG. 4 is a plan view schematically illustrating the electroluminescent display device according to the first embodiment of the present disclosure.

FIG. 4 is a plan view schematically illustrating the electroluminescent display device according to the first embodiment of the present disclosure.

As illustrated in FIG. 4, the light-emitting diode D of the electroluminescent display device 100 of FIG. 3 according to the first embodiment of the present disclosure includes a plurality of holes H.

The plurality of reflective patterns RP may be exposed by the plurality of holes H of the light-emitting diode D.

Each of the plurality of holes H may have a hexagonal shape in plan view, but embodiments are not limited thereto. Each of the plurality of holes H may have various other shapes in plan view, such as a semicircular shape, a semielliptical shape, a quadrilateral shape, and a circular shape, or the like.

The plurality of holes H of the light-emitting diode D may be formed along the shape of the plurality of openings 141b of FIG. 3 of the first electrode 141 of FIG. 3.

Therefore, each of the plurality of openings 141b of FIG. 3 of the first electrode 141 of FIG. 3 may have a hexagonal shape in plan view, but embodiments are not limited thereto. Each of the plurality of openings 141b may have various other shapes in plan view, such as a semicircular shape, a semielliptical shape, a quadrilateral shape, and a circular shape, or the like.

The shape of the plurality of openings 141b of FIG. 3 of the first electrode 141 of FIG. 3 may be formed through a process such as photolithography, wet etching, and dry etching. In this case, the shape of the plurality of openings 141b of FIG. 3 of the first electrode 141 of FIG. 3 may be adjusted by controlling a heat treatment process.

Figure 5:
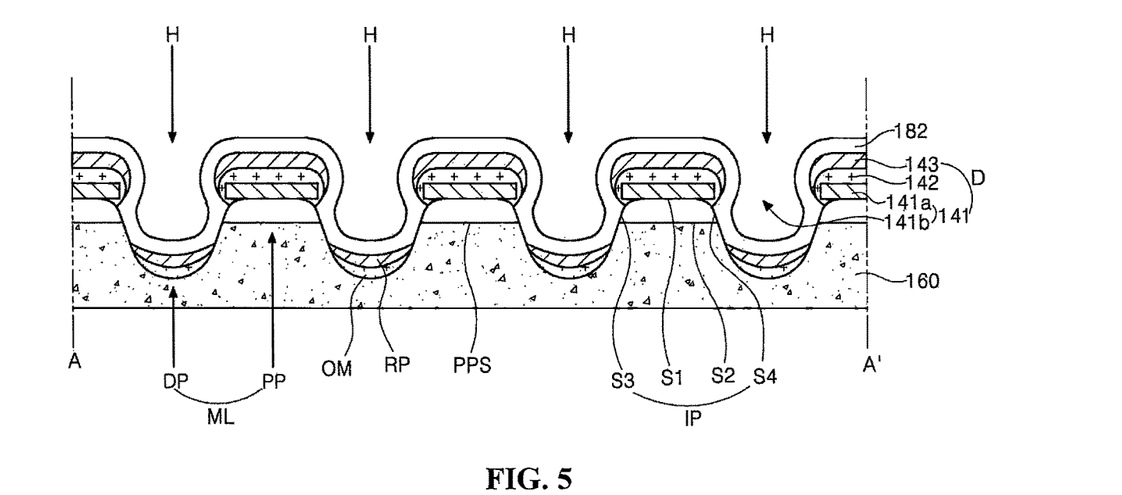
FIG. 5 is a cross-sectional view taken along line A-A' of FIG. 4.

FIG. 5 is a cross-sectional view taken along line A-A' of FIG. 4. Description will be given with reference to FIGS. 4 and 5.

As illustrated in FIG. 5, to improve light extraction efficiency in the electroluminescent display device 100 according to the first embodiment of the present disclosure, a micro lens ML may be disposed in the overcoat layer 160 corresponding to the emissive area EA.

Here, the micro lens ML may include a plurality of depressed portions DP and a plurality of protruding portions PP, but embodiments are not limited thereto, and the micro lens ML may have various other forms.

A top surface PPS of each of the plurality of protruding portions PP may be formed to be flat.

Meanwhile, each of the plurality of depressed portions DP may have a shape in which a width progressively narrows toward the first substrate 110. For example, each of the plurality of depressed portions DP may have a semicircular shape or a trapezoidal shape in cross-sectional view, but embodiments are not limited thereto.

Further, the overcoat layer 160 may be formed of an organic material having a refractive index of about 1.5 to 1.55, but embodiments are not limited thereto.

In the electroluminescent display device 100 according to the first embodiment of the present disclosure, the reflective pattern RP may be disposed over each of the plurality of depressed portions DP.

The reflective pattern RP may be formed of Al, Mg, Ag, or an alloy thereof, but embodiments are not limited thereto.

The reflective patterns RP may also be disposed along the shape of the plurality of depressed portions DP.

The reflective patterns RP may also be formed only in partial areas of the plurality of depressed portions DP. That is, the reflective pattern RP may be formed to cover only a partial area of the corresponding depressed portion DP or formed to cover the entire corresponding depressed portion DP.

In addition, to efficiently make light be incident on the reflective pattern RP using refraction of light at a contact surface between the insulating patterns IP and the plurality of protruding portions PP, it is preferable that the reflective pattern RP is formed lower than the top surface PPS of each of the plurality of protruding portions PP, but embodiments are not limited thereto.

Further, by disposing the reflective pattern RP along the shape of the plurality of depressed portions DP in which a width progressively narrows toward the first substrate 110, a portion of light output toward the first substrate 110 may be efficiently reflected toward the second substrate 112.

In the meantime, residual layer OM formed of the same material as the light-emitting layer 142 may be present between the plurality of depressed portions DP and the respective reflective patterns RP.

The residual layer OM is formed when materials for forming the light-emitting layer 142 are left on a top surface of each of the plurality of depressed portions DP during a manufacturing process.

Further, in the electroluminescent display device 100 of FIG. 3 according to the first embodiment of the present disclosure, an insulating pattern IP may be disposed on the top surface PPS of each of the plurality of protruding portions PP.

The insulating pattern IP may include a first surface S1 which contacts the electrode portion 141a of the first electrode 141, a second surface S2 which contacts the top surface PPS of each of the plurality of protruding portions PP of the overcoat layer 160, and third and fourth surfaces S3 and S4 which are side surfaces connecting the first surface S1 and the second surface S2.

In this case, the reflective pattern RP is not disposed at the third and fourth surfaces S3 and S4 of the insulating pattern IP. Accordingly, light is allowed to travel to the third and fourth surfaces S3 and S4.

Further, the refractive index of the insulating pattern IP may be larger than the refractive index of the overcoat layer 160.

As described above, in the electroluminescent display device 100 according to the first embodiment of the present disclosure, the reflective pattern RP may be disposed corresponding to each of the plurality of depressed portions DP of the overcoat layer 160, and the insulating pattern IP having a refractive index larger than that of the overcoat layer 160 may be disposed corresponding to each of the plurality of protruding portions PP of the overcoat layer 160.

The light-emitting diode D including the first electrode 141, the light-emitting layer 142, and the second electrode 143 may be disposed on the overcoat layer 160 and the insulating pattern IP.

The light-emitting diode D of the electroluminescent display device 100 according to the first embodiment of the present disclosure may include a plurality of holes H corresponding to the plurality of depressed portions DP.

In more detail, the first electrode 141 may include the electrode portions 141a and the plurality of openings 141b.

Here, the electrode portions 141a of the first electrode 141 may be disposed corresponding to the insulating patterns IP, which are formed corresponding to the plurality of protruding portions PP, respectively. That is, the plurality of protruding portions PP of the overcoat layer 160, the insulating patterns IP, and the electrode portions 141a may be stacked in that order.

Further, the plurality of openings 141b of the first electrode 141 may be disposed corresponding to the plurality of depressed portions DP, respectively. That is, the reflective patterns RP formed corresponding to the plurality of depressed portions DP, respectively, may be exposed by the plurality of openings 141b of the first electrode 141.

The electrode portion 141a of the first electrode 141 may have a flat top surface, but embodiments are not limited thereto.

The light-emitting layer 142 may be disposed corresponding to the electrode portions 141a of the first electrode 141.

That is, the light-emitting layer 142 having holes which correspond to the openings 141b of the first electrode 141 may be formed in the emissive area EA.

In addition, the light-emitting layer 142 may be disposed along the shape of the electrode portions 141a of the first electrode 141 in the emissive area EA. For example, the light-emitting layer 142 may have a flat top surface.

The second electrode 143 for supplying one of electrons or holes to the light-emitting layer 142 may be disposed on the light-emitting layer 142.

In this case, the second electrode 143 may be formed corresponding to the light-emitting layer 142 in the emissive area EA. That is, the second electrode 143 may have holes corresponding to the openings 141b of the first electrode 141.

The first electrode 141, the light-emitting layer 142, and the second electrode 143 form the light-emitting diode D, and the light-emitting diode D may have the holes H which respectively correspond to the plurality of depressed portions DP of the overcoat layer 160.

Accordingly, the light-emitting diode D may expose the reflective pattern RP disposed on each of the plurality of depressed portions DP.

The second passivation layer 182, which is configured to cover the second electrode 143, the reflective patterns RP, and the insulating patterns IP, may be formed.

Accordingly, a portion of light output from the light-emitting diode D toward the first substrate 110 may be refracted to a place where the reflective pattern RP is disposed by using the difference in the refractive indices of the insulating pattern IP and the overcoat layer 160, and the reflective pattern RP may reflect incident light toward the second substrate 112 to realize upward emission, so that dual emission toward both the first substrate 110 and the second substrate 112 is possible.

In addition, the reflective pattern RP may be formed of the same material as the second electrode 143 and at the same time using the same process steps. In this case, the reflective pattern RP may be formed at each of the plurality of depressed portions DP by using the process used when forming the second electrode 143 without a separate process. Therefore, an additional process is not required, thereby reducing the overall manufacturing cost and process steps involved.

Figure 6:
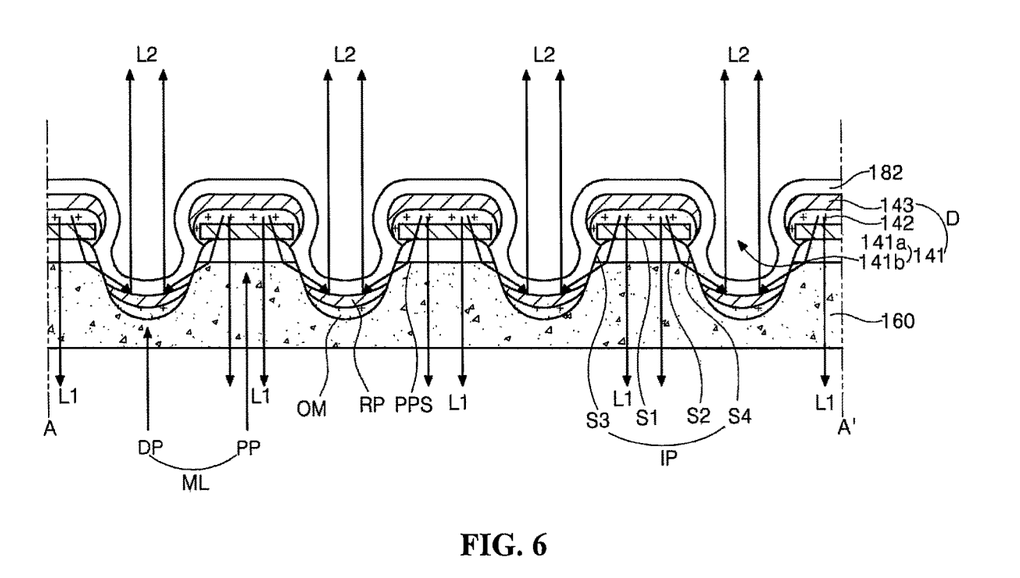
FIG. 6 is a view schematically illustrating an optical path of the electroluminescent display device according to the first embodiment of the present disclosure.

FIG. 6 is a view schematically illustrating an optical path of the electroluminescent display device according to the first embodiment of the present disclosure. Description will be given with reference to FIGS. 3, 5, and 6.

As illustrated in FIG. 6, the electroluminescent display device 100 according to the first embodiment of the present disclosure outputs rays of light L1 and L2 toward both the first substrate 110 of FIG. 3 and the second substrate 112 of FIG. 3.

That is, first light L1, which is perpendicularly incident on the electrode portion 141a of the first electrode 141 among light emitted from the light-emitting layer 142, passes through the electrode portion 141a of the first electrode 141, the insulating pattern IP, and the overcoat layer 160 of FIG. 3 without change and travels toward the first substrate 110 of FIG. 3.

In addition, second light L2, which is incident with a predetermined slope on the electrode portion 141a of the first electrode 141 among light emitted from the light-emitting layer 142, is refracted and travels to a place where the reflective pattern RP is disposed due to the difference in the refractive indices of the insulating pattern IP and the overcoat layer 160, is reflected by the reflective pattern RP, passes through the hole H of the light-emitting diode D, and travels toward the second substrate 112 of FIG. 3.

The first light L1 traveling toward the first substrate 110 of FIG. 3 is color-changed when passing through the bottom color filter pattern 150a of FIG. 3 and then output to the outside. The second light L2 traveling toward the second substrate 112 of FIG. 3 is color-changed when passing through the top color filter pattern 150b of FIG. 3 and then output to the outside.

Accordingly, the electroluminescent display device 100 of FIG. 3 according to the first embodiment of the present disclosure is capable of effectively emitting light toward both the first substrate 110 of FIG. 3 and the second substrate 112 of FIG. 3 using the reflective pattern RP and the insulating pattern IP.

Further, the micro-cavity effect may be realized using the second electrode 143.

However, in order to output light toward both the first substrate 110 and the second substrate 112, the bottom and top color filter patterns 150a and 150b of FIG. 3 are required, and there is a problem in that it is difficult to align the bottom and top color filter patterns 150a and 150b of FIG. 3 with the emissive area EA of FIG. 3 of each pixel.

Hereinafter, an electroluminescent display device according to a second embodiment which is capable of outputting light toward both the first substrate 110 of FIG. 3 and the second substrate 112 of FIG. 3 without the bottom and top color filter patterns 150a and 150b of FIG. 3 will be described. This process will simplify the overall manufacturing process.

Second Embodiment

Hereinafter, detailed description of configurations identical or similar to those of the first embodiment may be omitted.

Figure 7:
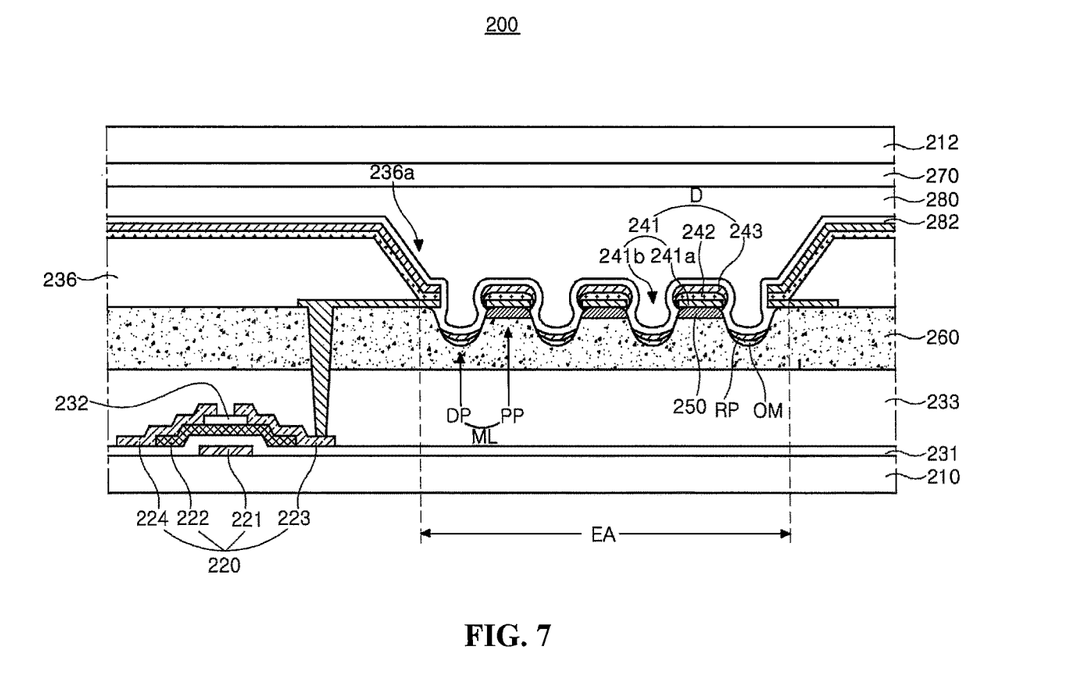
FIG. 7 is a cross-sectional view schematically illustrating an electroluminescent display device according to a second embodiment of the present disclosure.

FIG. 7 is a cross-sectional view schematically illustrating an electroluminescent display device according to a second embodiment of the present disclosure.

As illustrated in FIG. 7, an electroluminescent display device 200 according to the second embodiment of the present disclosure includes first and second substrates 210 and 212, a thin film transistor 220, and a light-emitting diode D electrically connected to the thin film transistor 220.

The thin film transistor 220 of the electroluminescent display device 200 according to the second embodiment of the present disclosure may include a gate electrode 221, an active layer 222, a source electrode 223, and a drain electrode 224 on the first substrate 210.

Specifically, the gate electrode 221 of the thin film transistor 220 and a gate insulation layer 231 may be disposed on the first substrate 210.

The active layer 222 which overlaps the gate electrode 221 may be disposed on the gate insulation layer 231.

An etch stopper 232 for protecting a channel region of the active layer 222 may be disposed on the active layer 222.

The source electrode 223 and the drain electrode 224 may be disposed on the active layer 222 and contact the active layer 222.

The electroluminescent display device 200 to which the second embodiment of the present disclosure is applicable is not limited to that illustrated in FIG. 7. The electroluminescent display device 200 may further include a buffer layer disposed between the first substrate 210 and the active layer 222, and the etch stopper 232 may not be disposed thereon.

For convenience of description, only the driving thin film transistor has been illustrated from among various thin film transistors that may be included in the electroluminescent display device 200. Although the thin film transistor 220 will be described as having an inverted staggered structure or bottom gate structure in which the gate electrode 221 is disposed at an opposite side the source electrode 223 and the drain electrode 224 with respect to the active layer 222, this is merely an example, and a thin film transistor which has a coplanar structure or top gate structure in which the gate electrode 221 is disposed to at the same side as the source electrode 223 and the drain electrode 224 with respect to the active layer 222 may also be used.

A first passivation layer 233 may be disposed on the drain electrode 224 and the source electrode 223.

In this case, although the first passivation layer 233 is illustrated as flattening an upper portion of the thin film transistor 220, the first passivation layer 233 may also be disposed along the shapes of surfaces of elements located below the first passivation layer 233 instead of flattening the upper portion of the thin film transistor 220.

An overcoat layer 260 may be disposed on the first passivation layer 233.

The first passivation layer 233 may be omitted. That is, the overcoat layer 260 may be disposed on the thin film transistor 220.

Particularly, to improve light extraction efficiency in the electroluminescent display device 200 according to the second embodiment of the present disclosure, a micro lens ML may be disposed in the overcoat layer 260 corresponding to an emissive area EA.

In this case, the micro lens ML may include a plurality of depressed portions DP and a plurality of protruding portions PP, but embodiments are not limited thereto, and the micro lens ML may have various other forms.

For example, a micro lens ML which includes a plurality of protruding portions PP and connecting portions connecting adjacent protruding portions PP may also be formed in the overcoat layer 260.

The overcoat layer 260 serves as a planarizing layer in an area in which the plurality of depressed portions DP and the plurality of protruding portions PP are not disposed.

A portion of the overcoat layer 260 serving as the planarizing layer may be formed to be thicker than a portion of the overcoat layer 260 in which the micro lens ML is formed, but embodiments are not limited thereto.

Each of the plurality of depressed portions DP may have various shapes such as a hexagonal shape, a semicircular shape, a semielliptical shape, and a quadrilateral shape in plan view.

In addition, a top surface of each of the plurality of protruding portions PP may be formed to be flat.

Each of the plurality of depressed portions DP may have a shape in which a width progressively narrows toward the first substrate 210. For example, each of the plurality of depressed portions DP may have a semicircular shape or a trapezoidal shape in cross-sectional view, but embodiments are not limited thereto.

Further, the overcoat layer 260 may be formed of an organic material having a refractive index of about 1.5 to 1.55, but embodiments are not limited thereto.

In the electroluminescent display device 200 according to the second embodiment of the present disclosure, the reflective pattern RP may be disposed over each of the plurality of depressed portions DP.

The reflective pattern RP may be formed of Al, Mg, Ag, or an alloy thereof, but embodiments are not limited thereto.

Further, the reflective patterns RP may be disposed along the shape of the plurality of depressed portions DP.

The reflective patterns RP may also be formed only in partial areas of the plurality of depressed portions DP. That is, the reflective pattern RP may be formed to cover only a partial area of the corresponding depressed portions DP or formed to cover the entire corresponding depressed portion DP.

A residual layer OM formed of the same material as a light-emitting layer 242 may be present between the plurality of depressed portions DP and the reflective patterns RP.

The residual layer OM is formed when materials for forming the light-emitting layer 242 are left on a top surface of each of the plurality of depressed portions DP during a manufacturing process.

In the electroluminescent display device 200 according to the second embodiment of the present disclosure, a color filter pattern 250 may be disposed on a top surface of each of the plurality of protruding portions PP.

The color filter pattern 250 is configured to change a color of light emitted from the light-emitting layer 242, and may be one of a red color filter pattern, a green color filter pattern, and a blue color filter pattern.

The color filter pattern 250 may be disposed at a position which corresponds to an emissive area EA and may be disposed only in some portions of the emissive area EA.

A pixel of the present disclosure may include one or more subpixels. For example, a single pixel may include two to four subpixels.

Subpixel refers to a unit in which a specific type of color filter pattern 250 is formed or in which the light-emitting diode D is capable of emitting a particular color without the color filter pattern 250.

Colors defined in a subpixel may include red (R), green (G), blue (B), and, optionally, white (W), but embodiments are not limited thereto.

Particularly, in the electroluminescent display device 200 according to the second embodiment of the present disclosure, the color filter pattern 250 may be formed corresponding to each of top portions of the plurality of protruding portions PP of the overcoat layer 260, and the color filter pattern 250 may not be formed at the plurality of depressed portions DP of the overcoat layer 260.

A refractive index of the color filter pattern 250 may be larger than a refractive index of the overcoat layer 260.

As described above, in the electroluminescent display device 200 according to the second embodiment of the present disclosure, the reflective pattern RP may be disposed corresponding to the plurality of depressed portions DP of the overcoat layer 260, and the color filter pattern 250 having a refractive index larger than that of the overcoat layer 260 may be disposed corresponding to the plurality of protruding portions PP of the overcoat layer 260.

Accordingly, a portion of light output from the light-emitting diode D toward the first substrate 210 may be refracted to a place where the reflective pattern RP is disposed by using the difference in the refractive indices of the color filter pattern 250 and the overcoat layer 260, and the reflective pattern RP may reflect incident light toward the second substrate 212 to realize upward emission, so that dual emission toward both the first substrate 210 and the second substrate 212 is possible.

The reflective pattern RP may be formed of the same material and at the same time using the same process steps as a second electrode 243. In this case, the reflective pattern RP may be formed at each of the plurality of depressed portions DP by using the same process of forming the second electrode 243 without a separate process. Therefore, an additional process is not required, thereby reducing the overall manufacturing cost and number of process steps involved.

Particularly, since the color filter pattern 250 is disposed between the light-emitting diode D and the plurality of protruding portions PP of the overcoat layer 260, light output from the light-emitting layer 242 may be color-changed when passing through the color filter pattern 250 and then output toward the first substrate 210 and the second substrate 212.

Consequently, the bottom and top color filter patterns 150a and 150b of FIG. 3 of the electroluminescent display device 100 of FIG. 3 according to the first embodiment may be omitted.

Accordingly, the process is simplified, and the problem in which it is difficult to align the bottom and top color filter patterns 150a and 150b of FIG. 3 with the emissive area EA of each pixel may be solved.

Meanwhile, a light-emitting diode D including a first electrode 241, the light-emitting layer 242, and the second electrode 243 may be disposed on the overcoat layer 260 and the color filter pattern 250.

The first electrode 241 may be an anode or a cathode for supplying one of electrons or holes to the light-emitting layer 242.

A case in which the first electrode 241 of the electroluminescent display device 200 according to the second embodiment of the present disclosure is an anode will be described as an example.

The first electrode 241 may be formed of a conductive material having relatively high work function. For example, the first electrode 241 may be formed of a transparent conductive material such as ITO and IZO.

The first electrode 241 may be connected to the source electrode 223 of the thin film transistor 220 through a contact hole formed in the overcoat layer 260 and may be separately formed for each subpixel area.

The electroluminescent display device 200 according to the second embodiment of the present disclosure has been described as an example in which the thin film transistor 220 is an N-type thin film transistor and the first electrode 241 is connected to the source electrode 223, but embodiments are not limited thereto. When the thin film transistor 220 is a P-type thin film transistor, the first electrode 241 may also be connected to the drain electrode 224.

The first electrode 241 may also be electrically connected to the light-emitting layer 242 by being in contact with the light-emitting layer 242 with a conductive material therebetween.

The first electrode 241 of the electroluminescent display device 200 according to the second embodiment of the present disclosure may be disposed on the color filter pattern 250 in the emissive area EA.

The first electrode 241 may include electrode portions 241a and a plurality of openings 241b.

The electrode portions 241a of the first electrode 241 may be disposed corresponding to the respective color filter patterns 250, which are formed corresponding to the plurality of protruding portions PP, respectively. That is, the plurality of protruding portions PP of the overcoat layer 260, the color filter patterns 250, and the electrode portions 241a may be stacked in that order.

The plurality of openings 241b of the first electrode 241 may be disposed corresponding to the plurality of depressed portions DP, respectively. That is, the reflective patterns RP formed corresponding to the plurality of depressed portions DP, respectively, may be exposed by the plurality of openings 241b of the first electrode 241.

The electrode portions 241a of the first electrode 241 may have a flat top surface, but embodiments are not limited thereto.

A bank layer 236 may be disposed on the overcoat layer 260 and the first electrode 241.

The bank layer 236 may include an open portion 236a exposing the first electrode 241.

The bank layer 236 may be disposed between adjacent pixel (or subpixel) areas and serve to differentiate the adjacent pixel (or subpixel) areas.

The plurality of depressed portions DP and the plurality of protruding portions PP of the overcoat layer 260 may be disposed in the open portion 236a of the bank layer 236.

The light-emitting layer 242 may be disposed on the electrode portion 241a of the first electrode 241 exposed by the open portion 236a of the bank layer 236. That is, the light-emitting layer 242 may be disposed corresponding to the electrode portion 241a of the first electrode 241.

The light-emitting layer 242 may have a tandem white structure in which a plurality of light-emitting layers are stacked to emit white light. For example, the light-emitting layer 242 may include a first light-emitting layer configured to emit blue light and a second light-emitting layer disposed on the first light-emitting layer and configured to emit light having a color which turns white when mixed with blue, but embodiments are not limited thereto.

In this case, a luminescent material of the light-emitting layer 242 may be an organic luminescent material or an inorganic luminescent material such as a quantum dot.

The light-emitting layer 242 may be disposed along the shape of the electrode portions 241a of the first electrode 241 in the emissive area EA. For example, the light-emitting layer 242 may have a flat top surface.

The second electrode 243 for supplying one of electrons or holes to the light-emitting layer 242 may be disposed on the light-emitting layer 242.

In this case, the second electrode 243 may be an anode or a cathode.

A case in which the second electrode 243 of the electroluminescent display device 200 according to the second embodiment of the present disclosure is a cathode will be described as an example.

The second electrode 243 may be formed of a conductive material having relatively low work function and may be located substantially all over a display area. For example, the second electrode 243 may be formed of Al, Mg, Ag, or an alloy thereof to obtain the micro-cavity effect, but embodiments are not limited thereto.

In this case, the second electrode 243 may be formed corresponding to the light-emitting layer 242 in the emissive area EA. That is, the second electrode 243 may be disposed over the light-emitting layer 242 corresponding to the electrode portion 241a of the first electrode 241.

The first electrode 241, the light-emitting layer 242, and the second electrode 243 may form the light-emitting diode D, and the light-emitting diode D may have holes which respectively correspond to the plurality of depressed portions DP of the overcoat layer 260.

Accordingly, the light-emitting diode D may expose the reflective patterns RP respectively disposed on the plurality of depressed portions DP.

In this way, the light-emitting diode D including holes may be implemented using the plurality of depressed portions DP and the plurality of protruding portions PP of the overcoat layer 260.

A second passivation layer 282, which is configured to cover the second electrode 243, the reflective patterns RP, and the color filter patterns 250, may be formed.

An encapsulation layer 280 may be formed on the second passivation layer 282. That is, the encapsulation layer 280 may include at least one inorganic layer and at least one organic layer to prevent permeation of oxygen or moisture into the light-emitting layer 242 and the second electrode 243.

A planarizing layer 270 may be disposed between the encapsulation layer 280 of the first substrate 210 and the second substrate 212.

In the electroluminescent display device 200 according to the second embodiment of the present disclosure, the micro lens ML of the overcoat layer 260 may allow output of light which has not been extracted to the outside due to total reflection of the light inside the first electrode 241 and the light-emitting layer 242 among light emitted from the light-emitting layer 242. In this way, external luminous efficiency may be increased.

The reflective patterns RP may be disposed corresponding to the plurality of depressed portions DP of the overcoat layer 260, and the color filter patterns 250 having a refractive index larger than that of the overcoat layer 260 may be disposed corresponding to the plurality of protruding portions PP.

Accordingly, a portion of light output from the light-emitting diode D toward the first substrate 210 may be refracted to a place where the reflective pattern RP is disposed by using the difference in the refractive indices of the color filter pattern 250 and the overcoat layer 260, and the reflective pattern RP may reflect incident light toward the second substrate 212 to realize upward emission, so that light may be effectively output toward both the first substrate 210 and the second substrate 212.

Particularly, since the color filter pattern 250 is disposed between the light-emitting diode D and the plurality of protruding portions PP of the overcoat layer 260, light output from the light-emitting layer 242 may be color-changed when passing through the color filter pattern 250 and then output toward the first substrate 210 and the second substrate 212.

Consequently, the bottom and top color filter patterns 150a and 150b of FIG. 3 of the electroluminescent display device 100 of FIG. 3 according to the first embodiment may be omitted.

Accordingly, the process is simplified, and the problem in which it is difficult to align the bottom and top color filter patterns 150a and 150b of FIG. 3 with the emissive area EA of each pixel may be solved.

Figure 8:
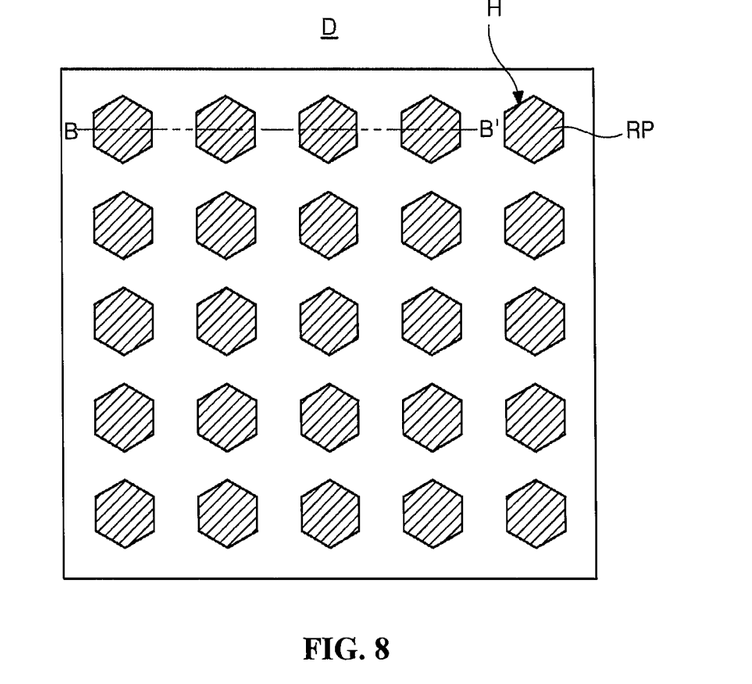
FIG. 8 is a plan view schematically illustrating the electroluminescent display device according to the second embodiment of the present disclosure.

FIG. 8 is a plan view schematically illustrating the electroluminescent display device according to the second embodiment of the present disclosure.

As illustrated in FIG. 8, the light-emitting diode D of the electroluminescent display device 200 of FIG. 7 according to the second embodiment of the present disclosure includes a plurality of holes H.

The plurality of reflective patterns RP may be exposed by the plurality of holes H of the light-emitting diode D.

Each of the plurality of holes H may have a hexagonal shape in plan view, but embodiments are not limited thereto. Each of the plurality of holes H may have various other shapes in plan view, such as a semicircular shape, a semielliptical shape, a quadrilateral shape, and a circular shape, or the like.

The plurality of holes H of the light-emitting diode D may be formed along the shape of the plurality of openings 241b of FIG. 7 of the first electrode 241 of FIG. 7.

Consequently, each of the plurality of openings 241b of FIG. 7 of the first electrode 241 of FIG. 7 may have a hexagonal shape in plan view, but embodiments are not limited thereto. Each of the plurality of openings 241b may have various other shapes in plan view, such as a semicircular shape, a semielliptical shape, a quadrilateral shape, and a circular shape, or the like.

The shape of the plurality of openings 241b of FIG. 7 of the first electrode 241 of FIG. 7 may be formed through a process such as photolithography, wet etching, and dry etching. In this case, the shape of the plurality of openings 241b of FIG. 7 of the first electrode 241 of FIG. 7 may be adjusted by controlling a heat treatment process.

Figure 9:
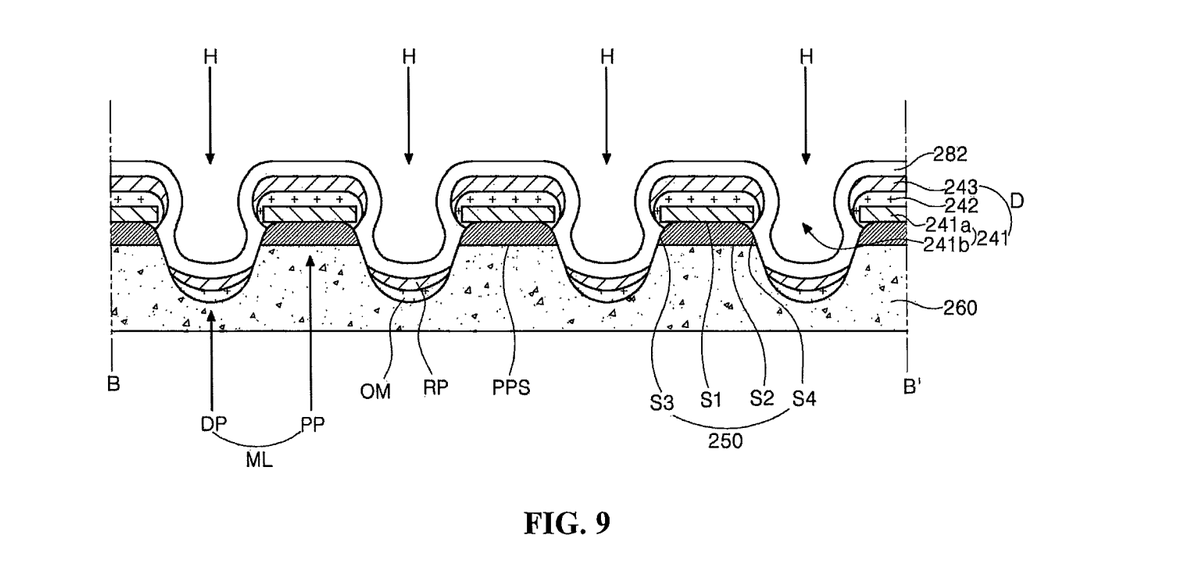
FIG. 9 is a cross-sectional view taken along line B-B' of FIG. 8.

FIG. 9 is a cross-sectional view taken along line B-B' of FIG. 8. Description will be given with reference to FIGS. 8 and 9.

As illustrated in FIG. 9, to improve light extraction efficiency in the electroluminescent display device 200 according to the second embodiment of the present disclosure, a micro lens ML may be disposed in the overcoat layer 260 corresponding to the emissive area EA.

The micro lens ML may include a plurality of depressed portions DP and a plurality of protruding portions PP, but embodiments are not limited thereto, and the micro lens ML may have various other forms.

A top surface PPS of each of the plurality of protruding portions PP may be formed to be flat.

Each of the plurality of depressed portions DP may have a shape in which a width progressively narrows toward the first substrate 210. For example, each of the plurality of depressed portions DP may have a semicircular shape or a trapezoidal shape in cross-sectional view, but embodiments are not limited thereto.

The overcoat layer 260 may be formed of an organic material having a refractive index of about 1.5 to 1.55, but embodiments are not limited thereto.

In the electroluminescent display device 200 according to the second embodiment of the present disclosure, the reflective pattern RP may be disposed over each of the plurality of depressed portions DP.

The reflective pattern RP may be formed of Al, Mg, Ag, or an alloy thereof, but embodiments are not limited thereto.

The reflective patterns RP may also be disposed along the shape of the plurality of depressed portions DP.

The reflective patterns RP may also be formed only in partial areas of the plurality of depressed portions DP. That is, the reflective patterns RP may be formed to cover only a partial area of the corresponding depressed portions DP or formed to cover the entire corresponding depressed portions DP.

To efficiently make light be incident on the reflective pattern RP using refraction of light at a contact surface between the color filter patterns 250 and the plurality of protruding portions PP, it is preferable that the reflective pattern RP is formed lower than the top surface PPS of each of the plurality of protruding portions PP, but embodiments are not limited thereto.

By disposing the reflective pattern RP along the shape of the plurality of depressed portions DP in which a width progressively narrows toward the first substrate 210, a portion of light output toward the first substrate 210 may be efficiently reflected toward the second substrate 212.

A residual layer OM formed of the same material as the light-emitting layer 242 may be present between the plurality of depressed portions DP and the reflective pattern RP.

The residual layer OM is formed when materials for forming the light-emitting layer 242 are left on a top surface of each of the plurality of depressed portions DP during a manufacturing process.

In the electroluminescent display device 200 of FIG. 7 according to the second embodiment of the present disclosure, the color filter pattern 250 may be disposed on the top surface PPS of each of the plurality of protruding portions PP.

The color filter pattern 250 may include a first surface S1 contacts the electrode portion 241a of the first electrode 241, a second surface S2 contacts the top surface PPS of each of the plurality of protruding portions PP of the overcoat layer 260, and third and fourth surfaces S3 and S4 which are side surfaces connecting the first surface S1 and the second surface S2.

In this case, the reflective pattern RP is not disposed at the third and fourth surfaces S3 and S4 of the color filter pattern 250. Accordingly, light is allowed to travel to the third and fourth surfaces S3 and S4.

The refractive index of the color filter pattern 250 may be larger than the refractive index of the overcoat layer 260.

As described above, in the electroluminescent display device 200 according to the second embodiment of the present disclosure, the reflective pattern RP may be disposed corresponding to each of the plurality of depressed portions DP of the overcoat layer 260, and the color filter pattern 250 having a refractive index larger than that of the overcoat layer 260 may be disposed corresponding to each of the plurality of protruding portions PP of the overcoat layer 260.

The light-emitting diode D including the first electrode 241, the light-emitting layer 242, and the second electrode 243 may be disposed on the overcoat layer 260 and the color filter pattern 250.

The light-emitting diode D of the electroluminescent display device 200 according to the second embodiment of the present disclosure may include a plurality of holes H corresponding to the plurality of depressed portions DP.

In more detail, the first electrode 241 may include the electrode portions 241a and the plurality of openings 241b.

The electrode portion 241a of the first electrode 241 may be disposed corresponding to the color filter patterns 250 which are formed corresponding to the plurality of protruding portions PP, respectively. That is, the plurality of protruding portions PP of the overcoat layer 260, the color filter patterns 250, and the electrode portions 241a may be stacked in that order.

The plurality of openings 241b of the first electrode 241 may be disposed corresponding to the plurality of depressed portions DP, respectively. That is, the reflective patterns RP formed corresponding to the plurality of depressed portions DP, respectively, may be exposed by the plurality of openings 241b of the first electrode 241.

The electrode portion 241a of the first electrode 241 may have a flat top surface, but embodiments are not limited thereto.

The light-emitting layer 242 may be disposed corresponding to the electrode portion 241a of the first electrode 241.

That is, the light-emitting layer 242 having holes which correspond to the openings 241b of the first electrode 241 may be formed in the emissive area EA.

The light-emitting layer 242 may be disposed along the shape of the electrode portion 241a of the first electrode 241 in the emissive area EA. For example, the light-emitting layer 242 may have a flat top surface.

The second electrode 243 for supplying one of electrons or holes to the light-emitting layer 242 may be disposed on the light-emitting layer 242.

In this case, the second electrode 243 may be formed corresponding to the light-emitting layer 242 in the emissive area EA. That is, the second electrode 243 may have holes corresponding to the openings 241b of the first electrode 241.

The first electrode 241, the light-emitting layer 242, and the second electrode 243 may form the light-emitting diode D, and the light-emitting diode D may have holes H which respectively correspond to the plurality of depressed portions DP of the overcoat layer 260.

Accordingly, the light-emitting diode D may expose the reflective patterns RP respectively disposed on the plurality of depressed portions DP.

A second passivation layer 282, which is configured to cover the second electrode 243, the reflective patterns RP, and the color filter patterns 250, may be formed.

Accordingly, a portion of light output from the light-emitting diode D toward the first substrate 210 may be refracted to a place where the reflective pattern RP is disposed by using the difference in the refractive indices of the color filter pattern 250 and the overcoat layer 260, and the reflective pattern RP may reflect incident light toward the second substrate 212 to realize upward emission, so that dual emission toward both the first substrate 210 and the second substrate 212 is possible.

The reflective pattern RP may be formed of the same material as the second electrode 243. In this case, the reflective pattern RP may be formed at each of the plurality of depressed portions DP by using the process of forming the second electrode 243 without a separate process. Therefore, an additional process is not required, thereby reducing the overall manufacturing process involved.

Particularly, since the color filter pattern 250 is disposed between the light-emitting diode D and the plurality of protruding portions PP of the overcoat layer 260, light output from the light-emitting layer 242 may be color-changed when passing through the color filter pattern 250 and then output toward the first substrate 210 and the second substrate 212.

Consequently, the bottom and top color filter patterns 150a and 150b of FIG. 3 of the electroluminescent display device 100 of FIG. 3 according to the first embodiment may be omitted.

Accordingly, the process is simplified, and the problem in which it is difficult to align the bottom and top color filter patterns 150a and 150b of FIG. 3 with the emissive area EA of each pixel may be solved.

Figure 10:
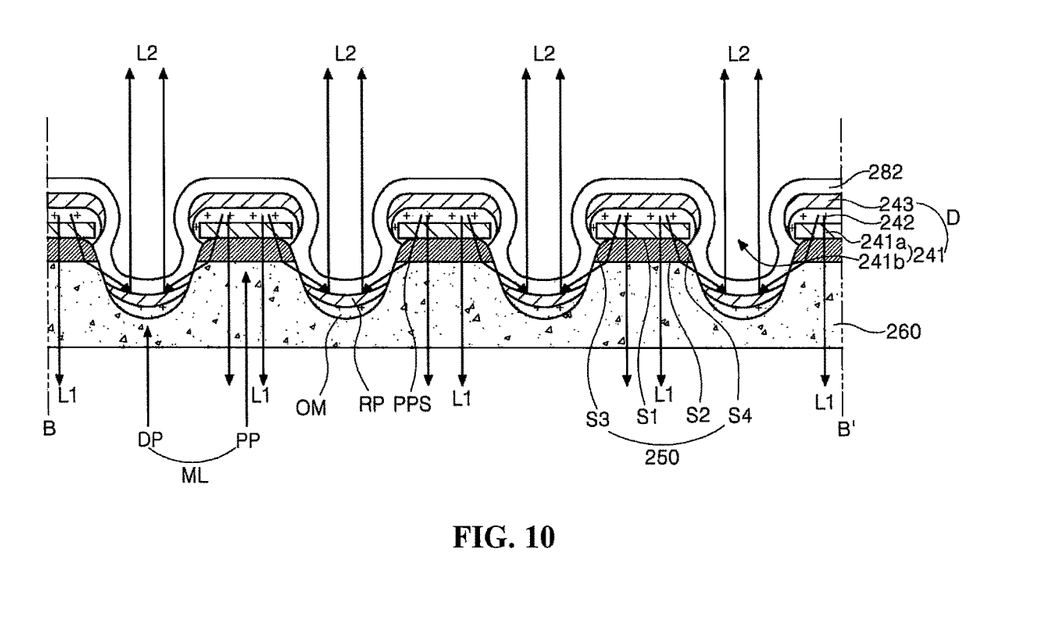
FIG. 10 is a view schematically illustrating an optical path of the electroluminescent display device according to the second embodiment of the present disclosure.

FIG. 10 is a view schematically illustrating an optical path of the electroluminescent display device according to the second embodiment of the present disclosure. Description will be given with reference to FIGS. 7, 9, and 10.

As illustrated in FIG. 10, the electroluminescent display device 200 of FIG. 7 according to the second embodiment of the present disclosure outputs rays of light L1 and L2 toward both the first substrate 210 of FIG. 7 and the second substrate 212 of FIG. 7.

That is, first light L1, which is perpendicularly incident on the electrode portion 241a of the first electrode 241 among light emitted from the light-emitting layer 242, passes through the electrode portion 241a of the first electrode 241, the color filter pattern 250, and the overcoat layer 260 without change and is output toward the first substrate 210.

In addition, second light L2, which is incident with a predetermined slope on the electrode portion 241a of the first electrode 241 among light emitted from the light-emitting layer 242, is refracted and travels to a place where the reflective pattern RP is disposed due to the difference in the refractive indices of the color filter pattern 250 and the overcoat layer 260 of FIG. 7, is reflected by the reflective pattern RP, passes through the hole H of the light-emitting diode D, and is output toward the second substrate 212 of FIG. 7.

Accordingly, the electroluminescent display device 200 of FIG. 7 according to the second embodiment of the present disclosure is capable of effectively emitting light toward both the first substrate 210 of FIG. 7 and the second substrate 212 of FIG. 7 using the reflective pattern RP and the color filter pattern 250.

Further, the micro-cavity effect may be realized using the second electrode 243.

Particularly, since the color filter pattern 250 is disposed between the light-emitting diode D and the plurality of protruding portions PP of the overcoat layer 260 of FIG. 7, light emitted from the light-emitting layer 242 may be color-changed when passing through the color filter pattern 250 and then output toward the first substrate 210 of FIG. 7 and the second substrate 212 of FIG. 7. Consequently, the bottom and top color filter patterns 150a and 150b of FIG. 3 of the electroluminescent display device 100 of FIG. 3 according to the first embodiment may be omitted.

Accordingly, the process is simplified, and the problem in which it is difficult to align the bottom and top color filter patterns 150a and 150b of FIG. 3 with the emissive area EA of each pixel may be solved.

In the present disclosure, a light-emitting diode is disposed over a plurality of protruding portions of an overcoat layer, and a reflective pattern is disposed over a plurality of depressed portions of the overcoat layer, so that light extraction efficiency can be improved and effective dual emission is possible.

Further, a color filter pattern is disposed between the plurality of protruding portions and the light-emitting diode, and thus the overall manufacturing process can be simplified.

The present disclosure has been described above with reference to exemplary embodiments thereof. However, those of ordinary skill in the art should understand that various modifications and changes may be made to the present disclosure within the scope not departing from the technical spirit and scope of the present disclosure described in the claims below.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electroluminescent display device, comprising:
a first substrate including an emissive area;
an overcoat layer disposed over the first substrate and including a plurality of protruding portions and a plurality of depressed portions in the emissive area;
a first electrode disposed over the overcoat layer and including an electrode portion which corresponds to each of the plurality of protruding portions and an opening which corresponds to each of the plurality of depressed portions;
a light-emitting layer disposed over the electrode portion;

a second electrode disposed over the light-emitting layer; and a reflective pattern disposed over each of the plurality of depressed portions.

2. The electroluminescent display device of claim 1, further including an insulating pattern, wherein each of the plurality of protruding portions has a flat top surface, and the insulating pattern is disposed between the flat top surface and the electrode portion.

3. The electroluminescent display device of claim 2, wherein the reflective pattern is formed lower than the flat top surface of each of the plurality of protruding portions.

4. The electroluminescent display device of claim 2, wherein a refractive index of the insulating pattern is larger than a refractive index of the overcoat layer.

5. The electroluminescent display device of claim 2, further comprising:

a second substrate facing the first substrate;

a bottom color filter pattern disposed between the first substrate and the overcoat layer; and a top color filter pattern disposed between the second substrate and the second electrode.

6. The electroluminescent display device of claim 1, further comprising a color filter pattern, wherein each of the plurality of protruding portions has a flat top surface and the color filter pattern is disposed between the flat top surface and the electrode portion.

7. The electroluminescent display device of claim 6, wherein a refractive index of the color filter pattern is larger than a refractive index of the overcoat layer.

8. The electroluminescent display device of claim 1, wherein a top surface of each of the electrode portion, the light-emitting layer, and the second electrode is flat.

9. The electroluminescent display device of claim 1, wherein the reflective pattern is formed of a same material as the second electrode.

10. The electroluminescent display device of claim 1, wherein each of the plurality of depressed portions has a shape in which a width progressively narrows toward the first substrate.

11. A display device, comprising:

a first substrate including an emissive area;

an overcoat layer disposed over the first substrate, the overcoat layer including a plurality of protruding portions and a plurality of depressed portions in the emissive area to form a plurality of micro lens, the protruding portions protruding against the first substrate;

a first electrode disposed over each of the plurality of protruding portions;

a light-emitting layer disposed over the first electrode;

a second electrode disposed over the light-emitting layer; and reflective patterns disposed over the plurality of depressed portions of the micro lens, respectively.

12. The display device of claim 11, wherein the reflective patterns are disposed along the shape of the plurality of depressed portions in which a width progressively narrows toward the first substrate.

\* \* \* \* \*